United States Patent
Ni et al.

(10) Patent No.: US 6,906,377 B2
(45) Date of Patent: Jun. 14, 2005

(54) FLASH MEMORY CELL AND FABRICATION THEREOF

(75) Inventors: Chih-Jung Ni, Hsinchu (TW); Chung-Ming Chu, Tainan (TW); Tu-Hao Yu, Hua-Lien Hsien (TW); Kuo-Chen Wang, Chiai (TW); Wen-Shun Lo, Hsinchu (TW); Haochieh Liu, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/250,038

(22) Filed: May 30, 2003

(65) Prior Publication Data

US 2004/0191992 A1 Sep. 30, 2004

(30) Foreign Application Priority Data

Mar. 26, 2003 (TW) ........................................ 92106739 A

(51) Int. Cl.[7] ............................................. H01L 29/788
(52) U.S. Cl. ........................ 257/315; 257/314; 257/316; 257/317
(58) Field of Search ................................ 257/314, 315, 257/316, 317

(56) References Cited

U.S. PATENT DOCUMENTS

| 5,767,005 | A | * | 6/1998 | Doan et al. | 438/593 |
| 5,830,771 | A | * | 11/1998 | Fukatsu et al. | 438/257 |
| 6,248,631 | B1 | * | 6/2001 | Huang et al. | 438/260 |
| 6,372,617 | B1 | * | 4/2002 | Kitamura | 438/593 |
| 6,413,818 | B1 | * | 7/2002 | Huang et al. | 438/257 |
| 6,713,348 | B2 | * | 3/2004 | Kao et al. | 438/257 |
| 6,762,093 | B2 | * | 7/2004 | Rudeck | 438/257 |

\* cited by examiner

*Primary Examiner*—B. William Baumeister
*Assistant Examiner*—Douglas Menz
(74) *Attorney, Agent, or Firm*—Jiang Chyun IP Office

(57) ABSTRACT

A flash memory cell is described, including at least a substrate, a tunnel oxide layer, a floating gate, an insulating layer, a control gate and an inter-gate dielectric layer. The tunnel oxide layer is disposed on the substrate. The floating gate is disposed on the tunnel oxide layer, and is constituted by a first conductive layer on the tunnel oxide layer and a second conductive layer on the first conductive layer. The second conductive layer has a bottom lower than the top surface of the first conductive layer, and has a bowl-like cross section. The insulating layer is disposed between the floating gates, and each control gate is disposed on a floating gate with an inter-gate dielectric layer between them.

9 Claims, 4 Drawing Sheets

FLASH MEMORY CELL AND FABRICATION THEREOF

CROSS REFERENCE TO RELATED APPLICATIONS

This application claims the priority benefit of Taiwan application serial no. 92106739, filed Mar. 26, 2003.

BACKGROUND OF INVENTION

1. Field of the Invention

The present invention relates to a semiconductor device and a method for fabricating the same. More particularly, the present invention relates to a flash memory cell and a method for fabricating the same.

2. Description of the Related Art

Flash memory devices are widely adopted in personal computers and electronic apparatuses, since they can be written, read and erased many times and are capable of retaining data when disconnected from electric power.

A typical flash memory cell has a stack-gate structure, which includes a floating gate and a control gate both made from doped polysilicon. The floating gate is disposed between the control gate and the substrate, and is floated without connecting to any circuit. The control gate is electrically connected to a word line. In addition, a tunnel oxide layer is disposed between the substrate and the floating gate, and an inter-gate dielectric layer is disposed between the floating gate and the control gate.

The operating voltage of a flash memory cell is inversely proportional to the gate coupling ratio (GCR) thereof, which is defined as the ratio of the capacitance between the control gate and the floating gate to the total capacitance of the cell. Therefore, increasing the capacitance between the two gates or decreasing the capacitance between the floating gate and the substrate lowers the operating voltage, while an increase in the capacitance between the two gates is generally achieved by increasing the area between the two gates. However, since the cell size is continuously reduced for upgrading the device integration, it is not easy to increase the area between the control gate and the floating gate and thereby raise the gate coupling ratio (GCR) of the cell.

SUMMARY OF INVENTION

In view of the foregoing, this invention provides a flash memory cell and a method for fabricating the same, wherein the area between the floating gate and the control gate is increased to raise the gate coupling ratio (GCR).

In the method for fabricating a flash memory cell of this invention, the state of the cell can be easily controlled by adjusting the height of the float gate, and the GCR is raised by increasing the surface area of the floating gate to enhance the voltage induced on the floating gate and improve the device performance.

The flash memory cell of this invention includes at least a substrate, a tunnel oxide layer, a floating gate, an insulating layer, a control gate and an inter-gate dielectric layer. The tunnel oxide layer is disposed on the substrate. The floating gate is disposed on the tunnel oxide layer, and is constituted of a first conductive layer on the tunnel oxide layer and a second conductive layer on the first conductive layer. The second conductive layer has a bottom lower than the top of the first conductive layer, and has a bowl-like cross section. The insulating layer is disposed between the floating gates, and each control gate is disposed on a floating gate with an inter-gate dielectric layer between them.

In the flash memory cell of this invention, the floating gate may be shaped as a bowl having a planar top surface, a dishing top surface or a U-shape top surface in a cross-sectional view. The top surface of the insulating layer is lower than that of the second conductive layer, but higher than that of the first conductive layer.

Since the floating gate is constituted of a first conductive layer and a second conductive layer and the second conductive layer is shaped as a bowl having a larger surface area, the area between the control gate and the floating gate can be increased to raise the gate coupling ratio of the cell. Consequently, the operating voltage of the flash memory device can be lowered, and the device performance can be improved for market requirements.

The method for fabricating a flash memory cell of this invention is described as follows. A substrate with a tunnel oxide layer, a first conductive layer, a first insulating layer and a mask layer sequentially formed thereon is provided. The mask layer, the first insulating layer, the first conductive layer and the tunnel oxide layer are patterned to form a plurality of stacked structures, and then a second insulating layer is filled between the stacked structures. A portion of the second insulating layer is removed so that the top surface thereof is lower than that of the mask layer, and then the mask layer is removed. Thereafter, the first insulating layer and a portion of the second insulating layer are simultaneously removed to form an opening on the first conductive layer, wherein the opening has a bowl-like cross section and has a bottom lower than the top surface of the first conductive layer. A second conductive layer is formed in the opening to serve as a floating gate together with the first conductive layer. An inter-gate dielectric layer is formed on the floating gate, and then a control gate is formed over the inter-gate dielectric layer.

In the above-mentioned method of this invention, another portion of the second insulating layer may be removed after the second conductive layer is formed in the opening and before the inter-gate dielectric layer is formed, so that the top surface of the second insulating layer is lower than that of the second conductive layer but higher than that of the first conductive layer. In addition, the second conductive layer may completely or partially fill the opening. Moreover, the step of removing a portion of the second insulating layer to make the top surface thereof lower than that of the mask layer, the step of removing the mask layer, and the step of removing the first insulating layer and a portion of the second insulating layer to form the opening on the first conductive layer are preferably performed by using wet etching.

Since this invention forms a second conductive layer having a bowl-like cross section on the first conductive layer to constitute a floating gate, the area between the floating gate and the control gate can be increased to raise the gate coupling ratio (GCR) of the cell. Moreover, during the formation of the opening having a bowl-like cross section, wet etching can be used from the step of removing a portion of the second insulating layer to the step of opening etching, so the opening can have a smooth surface. Moreover, each wet etching step can be performed in the same etching machine to save some steps in the process.

Furthermore, since a portion of the second insulating layer can be removed after the floating gate is formed to make the top surface thereof lower than that of the second conductive layer, the area between the floating gate and the control gate and the GCR are further increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

First Embodiment

FIGS. 1A–1D illustrate some structural variations of a flash memory cell according to the first preferred embodiment of this invention in a cross-sectional view, wherein the common constituents in the four drawings are labeled with the same reference numbers and described only once.

Figure 1A:
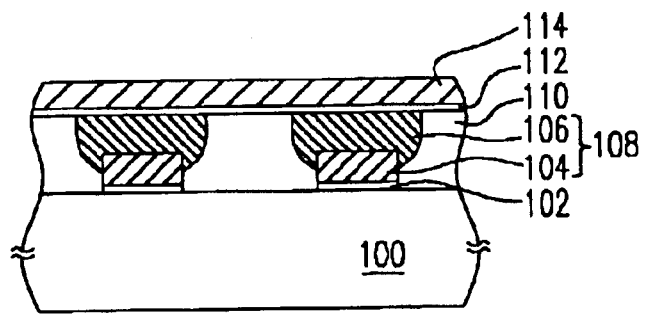
FIGS. 1A–1D illustrate some structural variations of a flash memory cell according to a first embodiment of this invention in a cross-sectional view.

Referring to FIG. 1A, the flash memory cell of this invention includes a substrate 100, a tunnel oxide layer 102, two conductive layers 104 and 106, an insulating layer 110, an inter-gate dielectric layer 112 and a conductive layer 114.

The conductive layer 104 is disposed on the substrate 100 with the tunnel oxide layer 102 between them, and the conductive layer 106 is disposed on the conductive layer 104 contacting with the latter. The two conductive layers 106 and 104 together constitute a floating gate 108, wherein the conductive layer 106 may have a bowl-like cross section. The insulating layer 110 fills up the gaps between the floating gates 108, and the control gate 114 is disposed over the floating gates 108 with the inter-gate dielectric layer 112 between them. The inter-gate dielectric layer 112 is an oxide/nitride/oxide (ONO) composite layer, for example.

As shown in FIG. 1A, the floating gate 108 is constituted of two conductive layers 104 and 106, wherein the conductive layer 106 has a bowl-like cross section and therefore has a large surface area. Therefore, the area between the control gate 114 and the floating gate 108 can be increased to raise the GCR and lower the operating voltage for market requirements.

Figure 1B:
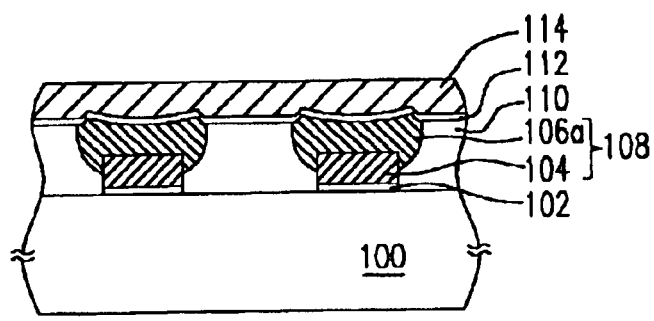
Figure 1C:
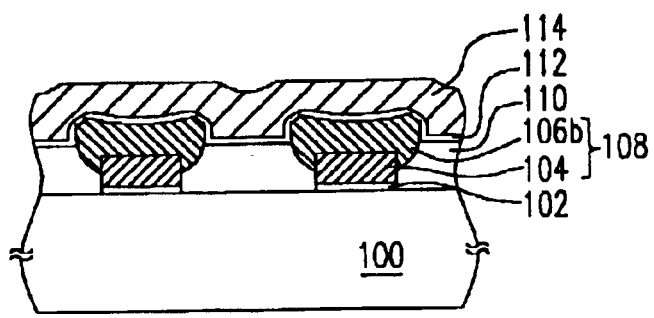
Figure 1D:
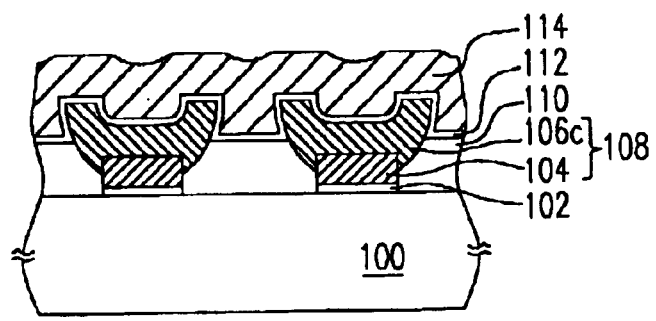

Though the conductive layer 106 having a bowl-like cross section in the aforementioned case has a planar top surface, the conductive layer 106 can be formed with a dishing top surface or a U-shaped top surface, as illustrated in FIGS. 1B–1D. Referring to FIG. 1B, the conductive layer 106a has a slightly dishing top surface, and looks like a broad bean in a cross-sectional view. In FIG. 1C, the conductive layer 106b also has a slightly dishing top surface, but the top surface of the insulating layer 110 is made lower than that of the conductive layer 106b. Thereby, the area between the conductive layer 106b and the control gate 114 is further increased, and the gate coupling ratio is further raised. In FIG. 1D, the conductive layer 106c has a U-shaped top surface and looks like a horseshoe, and the top surface of the insulating layer 110 is made lower than that of the conductive layer 106c. Thereby, the area between the conductive layer 106c and the control gate 114 is further increased, and the gate coupling ratio is further raised.

Second Embodiment

FIGS. 2A–2H illustrate a process flow of fabricating a flash memory device according to the second embodiment of this invention in a cross-sectional view. The second embodiment of this invention is described in detail referring to FIGS. 2A–2H.

Figure 2A:
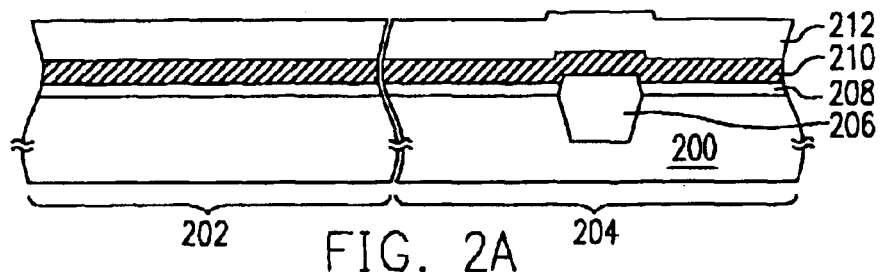
FIGS. 2A–2H illustrate a process flow of fabricating a flash memory device according to a second embodiment of this invention in a cross-sectional view.

Referring to FIG. 2A, a substrate 200 like a silicon substrate is provided, which is divided into a memory area 202 and a periphery circuit area 204. Device isolation 206 is formed in the periphery circuit area 204 with a local oxidation (LOCOS) process or a shallow trench isolation (STI) process to define active areas.

Referring to FIG. 2A again, a tunnel oxide layer 208, a conductive layer 210 and an insulating layer 212 are sequentially formed on the substrate 200. The tunnel oxide layer 208 is constituted of a material such as silicon oxide, and is formed with a method such as thermal oxidation or low-pressure chemical vapor deposition (LPCVD). The material of the conductive layer 210 is doped polysilicon, for example, which may be formed by depositing a layer of polysilicon with a LPCVD process using silane as a reaction gas, and then implanting the polysilicon layer with dopant ions. The insulating layer 212 is composed of a material such as high temperature oxide (HTO), and is formed with, for example, a CVD process using $SiH_2Cl_2/N_2O$ or $SiH_4/N_2O$ as reaction gases.

Figure 2B:
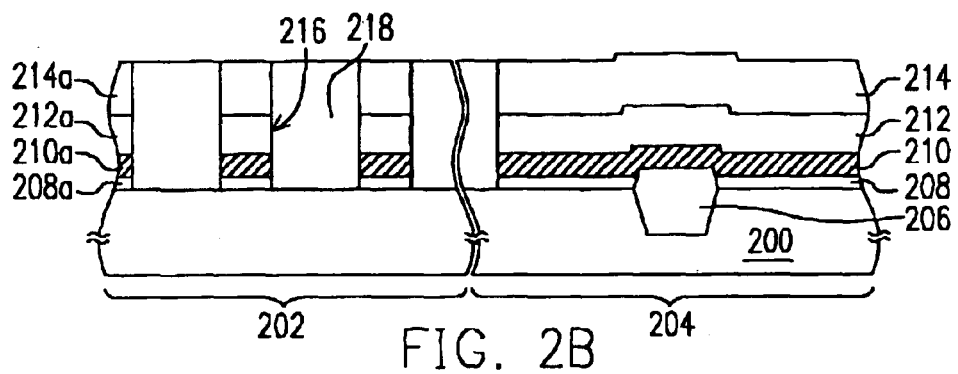

Referring to FIG. 2B, a mask layer 214 is formed on the insulating layer 212. The mask layer 214 is made from a material such as silicon nitride, and is formed with a LPCVD process using $SiH_2Cl_2/NH_3$ as reaction gases, for example. The mask layer 214 may also be made from other material, if only the material has a different etching selectivity to the insulating layer 212 and the other insulating layers formed subsequently.

Referring to FIG. 2B again, the mask layer 214, the insulating layer 212, the conductive layer 210, and the tunnel oxide layer 208 are patterned to form a plurality of stacked structures each consisting of, from bottom to top, a tunnel oxide layer 208a, a conductive layer 210a, an insulating layer 212a and a mask layer 214a. Thereafter, an insulating layer 218 is filled in the openings 216 between the stacked structures. The insulating layer 218 is composed of a material such as high-density-plasma oxide (HDP-Oxide), and is formed with plasma-enhanced chemical vapor deposition (PECVD), for example. The steps for filling the insulating layer 218 in the openings 216 include, for example, forming a layer of insulating material all over the substrate 200 and removing the insulating material outside the openings 216.

Figure 2C:
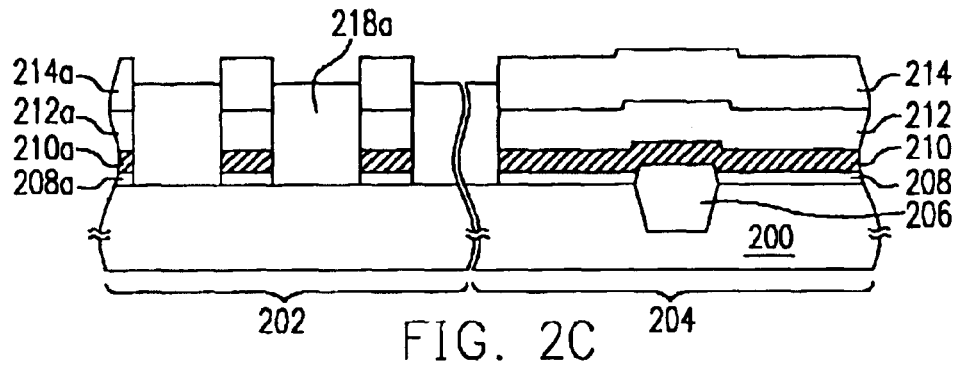

Referring to FIG. 2C, a portion of the insulating layer 218 is removed with, for example, a wet etching process using an etchant such as buffered oxide etcher (BOE), so as to adjust the depth of the openings that will be formed to serve as templates of floating gates. The remaining insulating layer 218 is labeled with "218a".

Figure 2D:
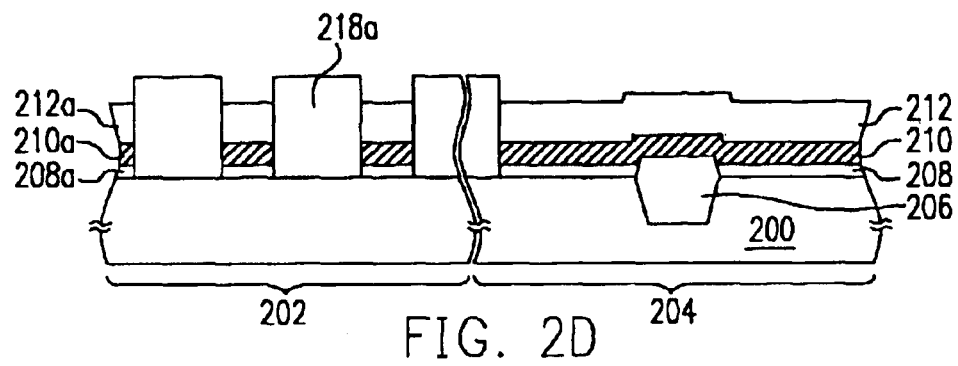

Referring to FIG. 2D, the mask layer 214a is removed to expose the top surface of the insulating layer 212a with, for example, a wet etching process that uses an etchant such as hot phosphoric acid.

Figure 2E:
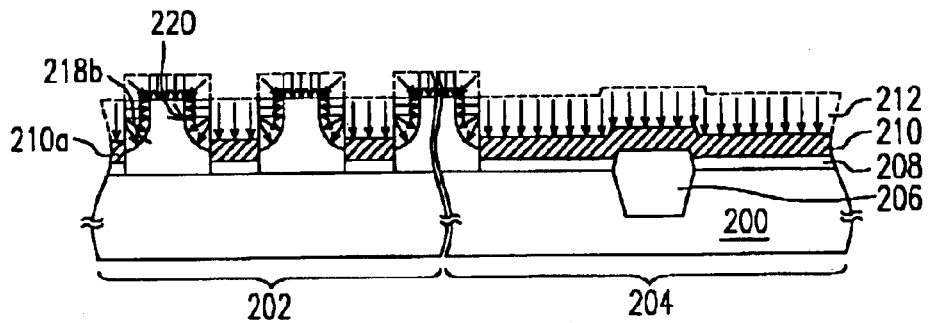

Referring to FIG. 2E, the insulating layer 212a and a portion of the insulating layer 218a are removed simultaneously to form openings 220, each of which has a bowl-like cross section and exposes the top surface of the conductive layer 210a, and has a bottom at a level between the top and the bottom of the conductive layer 210a.

The method for forming the openings 220 is, for example, a wet etching method that uses an etchant such as buffered oxide etcher (BOE). The remaining insulating layer after the etching process is labeled with "218b".

Figure 2F:
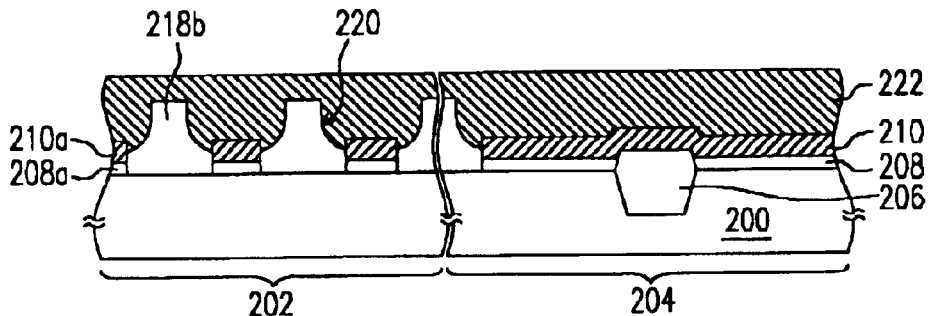

Referring to FIG. 2F, a conductive layer 222 is formed on the substrate 200 filling up the openings 220. The conductive layer 222 is constituted of a material such as doped polysilicon, which may be formed by, for example, depositing a layer of polysilicon with a LPCVD process using silane as a reaction gas, and then implanting the polysilicon layer with dopant ions.

Figure 2G:
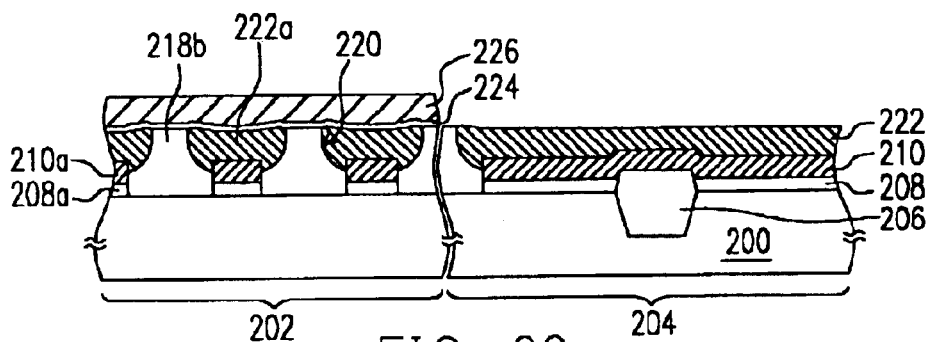

Referring to FIG. 2G, a portion of the conductive layer 222 is removed to expose the top surface of the insulating layer 218b, and the remaining conductive layer 222a and the conductive layer 210a together constitute a floating gate of the flash memory cell. The method for removing a portion of the conductive layer 222 may include a chemical mechanical polishing (CMP) process or an etching-back process. Consequently, a floating gate having a planar top surface as illustrated in FIG. 1A is obtained. However, if a dishing occurs on the conductive layer 222a because of the CMP process, the floating gate has a dishing top surface as illustrated in FIG. 1B.

Figure 2H:
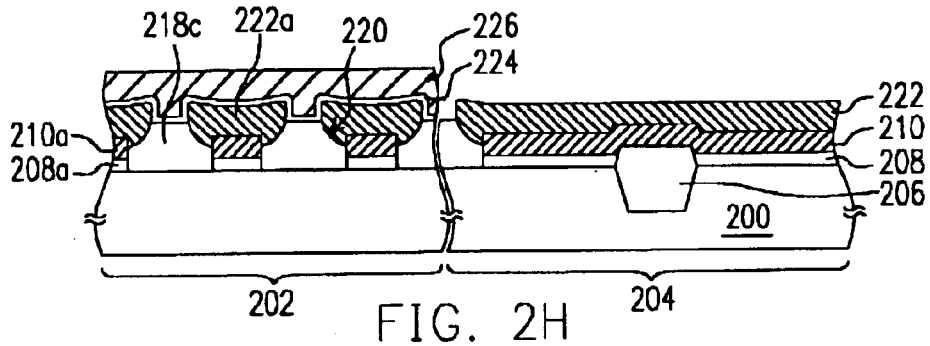

Referring to FIG. 2H, a portion of the insulating layer 218b is further etched away after the floating gate having a dishing top surface is formed, and the top surface of the remaining insulating layer 218c is at a level between the top surface of the conductive layer 222a and that of the conductive layer 210a. Consequently, a floating gate as illustrated in FIG. 1C can be obtained, which has a dishing top surface and a larger facing area with the control gate. Then, an inter-gate dielectric layer 224 like an ONO composite layer is formed on the floating gate, and another conductive layer 226 is formed over the inter-gate dielectric layer 224 as a control gate.

The descriptions of the subsequent processes for completing the flash memory device are omitted here since they are well known to those skilled in the art.

Since a floating gate is constituted by a conductive layer 210a and a conductive layer 222a having a bowl-like cross section in this embodiment, the area between the floating gate and the control gate can be increased to raise the gate coupling ratio (GCR) of the cell. Moreover, during the formation of the opening 220 having a bowl-like cross section, wet etching can be used from the step of removing a portion of the insulating layer 218 to the etching step of the opening 220, so the opening 220 can have a smooth surface. Moreover, each wet etching step can be performed in the same etching machine to save some steps in the process.

Furthermore, since a portion of the insulating layer 218b is removed after the floating gate is formed to make the top surface thereof at a level between the top surface of the conductive layer 222a and that of the conductive layer 210a, the area between the floating gate and the control gate is increased. Accordingly, the gate coupling ratio is further increased.

Third Embodiment

FIGS. 3A–3D illustrate a process flow of fabricating a flash memory device according to the third embodiment of this invention in a cross-sectional view. The third embodiment of this invention is described in detail referring to FIGS. 3A–3D, wherein the constituents that have been illustrated in FIGS. 2A–2H are labeled with the same reference numbers, and are not described again.

Figure 3A:
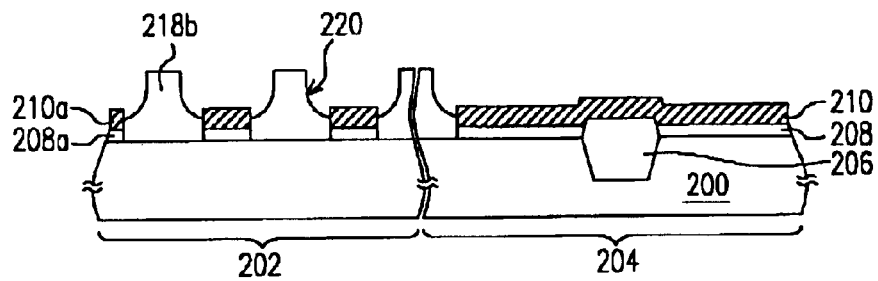
FIGS. 3A–3D illustrate a process flow of fabricating a flash memory device according to a third embodiment of this invention in a cross-sectional view.

Referring to FIG. 3A, a substrate 200 like a silicon substrate is provided, which is divided into a memory area 202 and a periphery circuit area 204. The above-mentioned processes that correspond to FIGS. 2A–2E in the second embodiment are sequentially performed to form a device isolation 206, a tunnel oxide layer 208/208a, a conductive layer 210/210a, an insulating layer 218b and an opening 220 having a bowl-like cross-section.

Figure 3B:
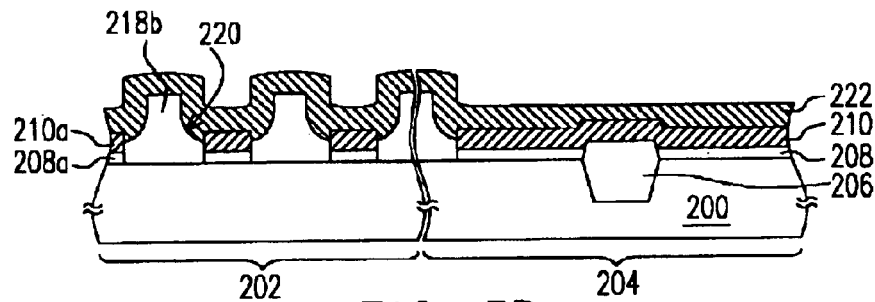

Referring to FIG. 3B, a conductive layer 222 is formed on the substrate 200 without fully filling up the openings 220. The conductive layer 222 is constituted of a material such as doped polysilicon, which may be formed by, for example, depositing a layer of polysilicon with a LPCVD process using silane ($SiH_4$) as a reaction gas, and then implanting the polysilicon layer with dopant ions.

Figure 3C:
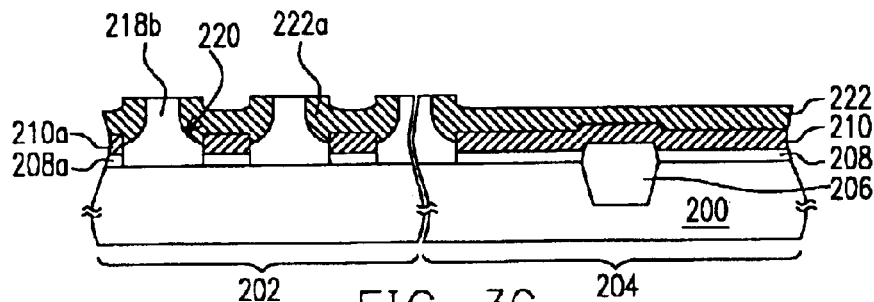

Referring to FIG. 3C, a portion of the conductive layer 222 is removed to expose the top surface of the insulating layer 218b, and the remaining conductive layer 222a, which has a U-shaped top surface and a horseshoe-like cross section, constitutes a floating gate together with the conductive layer 210a. The method for removing a portion of the conductive layer 222 may include a chemical mechanical polishing (CMP) process or an etching-back process.

Figure 3D:
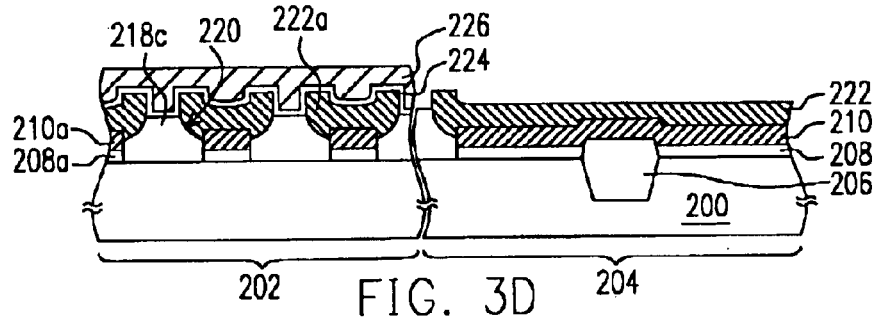

Referring to FIG. 3D, a portion of the insulating layer 218b is further etched away after the floating gate having a U-shaped top surface is formed, and the top surface of the remaining insulating layer 218c is at a level between the top surface of the conductive layer 222a and that of the conductive layer 210a. Consequently, a floating gate as illustrated in FIG. 1D is obtained, which has a U-shaped top surface and a larger facing area with the control gate. Thereafter, an inter-gate dielectric layer 224 like an ONO composite layer is formed on the floating gate, and another conductive layer 226 is formed over the inter-gate dielectric layer 224 as a control gate.

The descriptions of the subsequent processes for completing the flash memory device are omitted here since they are well known to those skilled in the art.

In the third embodiment, the conductive layer 222a formed on the conductive layer 210a has a U-shaped top surface, and therefore has a larger facing area with the control gate as compared with the floating gate having a planar top surface or a dishing top surface in the second embodiment. Therefore, the gate coupling ratio (GCR) of the cell is further increased in the third embodiment.

Moreover, since a portion of the insulating layer 218b is removed after the floating gate having a U-shaped top surface is formed to make the top surface of the remaining insulating layer 218c at a level between the top surface of the conductive layer 222a and that of the conductive layer 210a, the area between the floating gate and the control gate and the gate coupling ratio (GCR) are further increased.

Moreover, during the formation of the opening 220 having a bowl-like cross section, wet etching can be used from the step of removing a portion of the insulating layer 218 to the etching step of the opening 220, so the opening 220 can have a smooth surface. In addition, each wet etching step can be performed in the same etching machine to save some steps in the process.

It will be apparent to those skilled in the art that various modifications and variations can be made to the structure of the present invention without departing from the scope-or spirit of the invention. In view of the foregoing, it is intended that the present invention covers modifications and variations of this invention provided they fall within the scope of the following claims and their equivalents.

What is claimed is:

1. A flash memory cell, comprising:
   a substrate;
   a tunnel oxide layer on the substrate;

a plurality of floating gates on the tunnel oxide layer, wherein each floating gate comprises:
  a first conductive layer on the tunnel oxide; and
  a second conductive layer on the first conductive layer having a bowl-like cross section and a bottom lower than a top surface of the first conductive layer and substantially wider than a width of the first conductive layer;
an insulating layer between the floating gates;
a plurality of control gates, each disposed on a floating gate; and
an inter-gate dielectric layer between each pair of control gate and floating gate.

2. The flash memory cell of claim 1, wherein a top surface of the insulating layer is lower than a top surface of the second conductive layer, but is higher than the top surface of the first conductive layer.

3. The flash memory cell of claim 1, wherein the second conductive layer having a bowl-like cross section has a planar top surface.

4. The flash memory cell of claim 3, wherein a top surface of the insulating layer is lower than a top surface of the second conductive layer, but is higher than the top surface of the first conductive layer.

5. The flash memory cell of claim 1, wherein the second conductive layer having a bowl-like cross section has a dishing top surface.

6. The flash memory cell of claim 5, wherein a top surface of the insulating layer is lower than a top surface of the second conductive layer, but is higher than the top surface of the first conductive layer.

7. The flash memory cell of claim 1, wherein the second conductive layer having a bowl-like cross section has a U-shaped top surface.

8. The flash memory cell of claim 7, wherein a top surface of the insulating layer is lower than a top surface of the second conductive layer, but is higher than the top surface of the first conductive layer.

9. The flash memory cell of claim 1, wherein the inter-gate dielectric layer comprises an oxide/nitride/oxide (ONO) composite layer.

* * * * *